United States Patent [19]

Thompson

[11] Patent Number: 5,757,217
[45] Date of Patent: May 26, 1998

[54] SLOW SPEED DRIVER WITH CONTROLLED SLEW RATE

[75] Inventor: James E. Thompson, Phoenix, Ariz.

[73] Assignee: Intel Corporation, Santa Clara, Calif.

[21] Appl. No.: 672,412

[22] Filed: Jun. 28, 1996

[51] Int. Cl.[6] .......................... H03K 17/16; H03K 6/04; H03F 3/26
[52] U.S. Cl. .................. 327/170; 327/310; 327/381; 327/384; 326/29
[58] Field of Search ....................... 326/29, 28, 27, 326/83; 327/381, 380, 379, 376, 374, 384, 170, 167, 165, 108, 318, 321, 310

[56] References Cited

U.S. PATENT DOCUMENTS

| | | | |
|---|---|---|---|
| 4,608,636 | 8/1986 | Beals | 364/422 |
| 4,855,622 | 8/1989 | Johnson | 326/26 |
| 4,857,863 | 8/1989 | Ganger et al. | 327/108 |
| 5,028,818 | 7/1991 | Go Ang et al. | 326/33 |
| 5,146,159 | 9/1992 | Lau et al. | 330/263 |
| 5,177,451 | 1/1993 | Lehmann | 330/263 |
| 5,194,760 | 3/1993 | Braun et al. | 327/170 |
| 5,216,293 | 6/1993 | Sei et al. | 326/27 |
| 5,436,588 | 7/1995 | Ghaffaripour | 327/538 |
| 5,469,096 | 11/1995 | Nessi et al. | 327/108 |
| 5,479,124 | 12/1995 | Pun et al. | 327/108 |

*Primary Examiner*—Timothy P. Callahan
*Assistant Examiner*—Terry L. Englund
*Attorney, Agent, or Firm*—Blakely, Sokoloff, Taylor & Zafman

[57] ABSTRACT

A driver circuit for transmitting data via an output node thereof to a transmission line includes a first driving device coupled to the output node and a second driving device coupled to the same output node. The driver circuit further includes a slew rate controller coupled to the first and second driving devices. The slew rate controller includes a first reference device coupled to the first driving device. The first reference device generates a first current. The slew rate controller also includes a second reference device coupled to the second driving device. The second reference device generates a second current. The slew rate controller further includes a summing device, coupled to the first and second reference devices. The summing node is also coupled to the output node, via an integrating device, to the output node. The summing device generates at the output node a slew rate proportional to the first current when the first driving device is substantially conducting. The summing device also generates at the output node a slew rate proportional to the second current when the second driving device is substantially conducting.

29 Claims, 5 Drawing Sheets

SLOW SPEED DRIVER WITH CONTROLLED SLEW RATE

BACKGROUND OF THE INVENTION

(1) Field of the Invention

The present invention relates generally to integrated circuits. More specifically, the present invention relates to a driver circuit with a slew rate controller.

(2) Description of the Related Art

Slew rate controllers and driver circuits are generally known in the art. FIG. 1 is a diagram of an idealized data signal driven by a driver circuit (not shown) to a bus line (not shown). As one can see, this idealized representation of the digital data signal is a perfect "square wave." The voltage on the line instantaneously changes from $V_{SS}$ to $V_{DD}$, when the information transmitted on the line changes from logical 0 to logical 1. Also, the voltage on the line instantaneously changes from $V_{DD}$ to $V_{SS}$ when the information transmitted changes from logic 1 to logic 0. Generally, when a driver circuit sends a signal at 0 logic level ($V_{SS}$) on the bus line, the driver must pull down the bus line to $V_{SS}$ and thus "sink" sufficient current to pull down and hold the line at $V_{SS}$ for the duration of a data transfer cycle. When the driver circuit, however, sends a logic 1 signal ($V_{DD}$) on the bus line, it must pull up the bus line to $V_{DD}$ and thus must "source" sufficient current to pull up and hold the bus line at $V_{DD}$ for the duration of a data transfer cycle.

FIG. 2 illustrates a timing diagram of a typical "real" digital data signal transmitted by a driver onto a bus line. In real circuits, it takes a finite amount of time for a driver circuit to shift the voltage level of the transmitted signal from $V_{SS}$ to $V_{DD}$ or vice versa. This time is referred to as the rise time of the data signal, and the rate of change of the voltage on the line dv/dt is referred to as slew rate. The duration of this rise time is determined by the driving characteristics of the electrical driver circuit outputting data on the bus and by the electrical load (capacitance, inductance, and resistance) characteristics of the transmission line and of the circuit receiving the signal.

At time t0, a driving circuit begins to output a logic 0 data signal on the bus line by lowering the voltage level to $V_{SS}$. (Prior to time t0, the driving circuit is in an "off" or high impedance state and the voltage on the line is at $V_{DD}$.) Because it takes time for the driving circuit to sink current from the transmission line in order to lower the voltage level, the voltage level does not reach $V_{SS}$ until a time t1. The interval $t_{rr}$ from time t0 to t1, is the rise time of the circuit and the slope of the voltage change during that rise time is the slew rate.

After time $t_1$, the voltage on the line does not remain at $V_{SS}$ because of the interaction of the driving current and the inductance in the circuit. The voltage actually bounces about $V_{SS}$ and then decays towards $V_{SS}$ after time interval $t_b$, when the voltage on the line becomes more stable. The data may then be read by a receiving circuit during the interval $t_r$. At time $t_3$, the transmitting circuit begins to stop driving the data. It takes the circuit a finite amount of time $t_{off}$ to completely stop driving the line and return to a high impedance state.

As one can see from FIG. 2, the signal shown is bouncing. Bouncing is the result of the inductance, inherent in real-world circuits, and of the transmission lines. Bouncing creates high frequency noise on the bus line and in the power source. This noise can seriously degrade overall system performance. The amount of bouncing is in part a function of the slew rate of the circuit in that the faster the slew rate, the more the signal on the line bounces.

In certain applications, such as applications wherein bouncing seriously interferes with the performance of the system, it is important to control the slew rate of the signal driven by the driver circuit to obtain a smooth and slow slew rate. Also, for certain peripheral devices, such as mouses or keyboards which do not require high speed data transmission, it is more economical to use slower data transmission rates. For these applications, a slow speed driver is preferable as the overhead that otherwise is required for transmission of data at high speed would involve expensive interfaces. Furthermore, in applications complying to the Universal Serial Bus (USB) specification, which utilize the above-mentioned peripheral devices, the slew rate needs to be controlled to vary only within a limited range. For information related to USB see *The Universal Serial Bus Device Class Definition for Communication Devices*, 0.7 Draft Revision available from Intel Corporation, Santa Clara, Calif.

Additionally, certain applications utilize a drivers driving signals via a transmission line to peripherals or other circuits located at another end of the transmission line. Such peripherals or other circuits may utilize upper rail voltages lower than the ones that the driver circuit utilizes. In such case, if reflections propagate back, via the transmission line, between the driver circuit and the peripherals, and these reflections have a voltage amplitude larger than the upper rail voltage supply of the peripherals, the functioning of the peripherals may be substantially impaired. It is desirable to provide a slow speed driver with a termination device that can substantially absorb reflections from the transmission line thereby avoiding reflections bouncing back and forth via the transmission line or undesirably high currents flowing through the devices of the driver.

Furthermore, in certain applications that utilize gate arrays it is desirable to "integrate" a driver circuit within a gate array itself, i.e., using the active devices already existent in the gate array. It is desirable to provide a slow speed driver with a relatively low number of devices, thereby reducing the cost of the circuit. It is also desirable to provide a slow speed driver with a slew rate control circuit which is not sensitive to process changes, which is simple, portable, and smaller in size.

BRIEF SUMMARY OF THE INVENTION

The present invention provides a driver circuit for transmitting data via an output node thereof to a transmission line. The driver circuit includes a first driving device coupled to the output node and a second driving device coupled to the same output node. The driver circuit further includes a slew rate controller coupled to the first and second driving devices. The slew rate controller includes a first reference device coupled to the first driving device. The first reference device generates a first current. The slew rate controller also includes a second reference device coupled to the second driving device. The second reference device generates a second current. The slew rate controller further includes a summing device, coupled to the first and second reference devices. The summing node is also coupled to the output node, via an integrating device, to the output node. The summing device generates at the output node a slew rate proportional to the first current when the first driving device is substantially conducting. The summing device also generates at the output node a slew rate proportional to the second current when the second driving device is substantially conducting.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one having an ordinary skill in the art will recognize that the invention can be practiced without these specific details. In some instances, well-known circuits, structures, and techniques have not been shown in detail to avoid obscuring the present invention.

Figure 1:
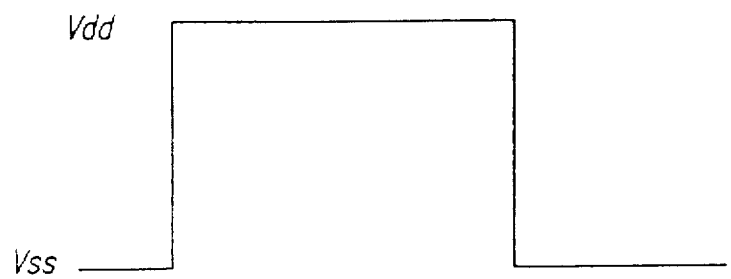
FIG. 1 illustrates a diagram of an idealized data signal driven by a driver circuit.
Figure 2:
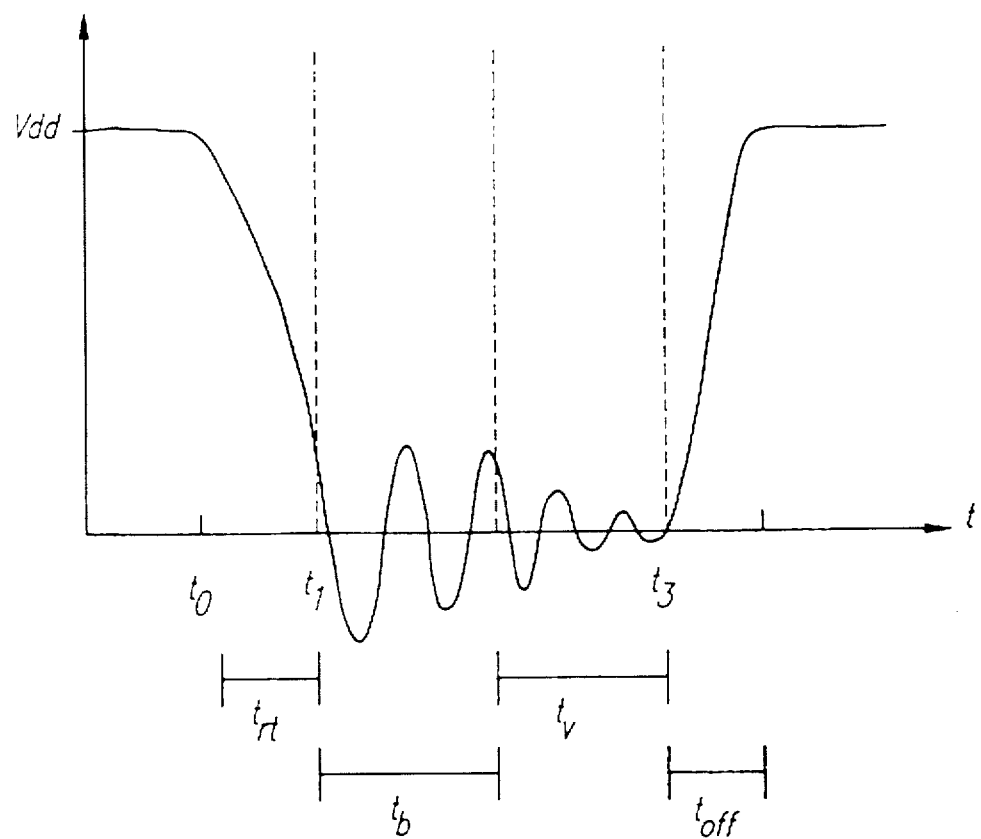
FIG. 2 illustrates a timing diagram of a real digital data signal transmitted by a driver circuit.
Figure 3:
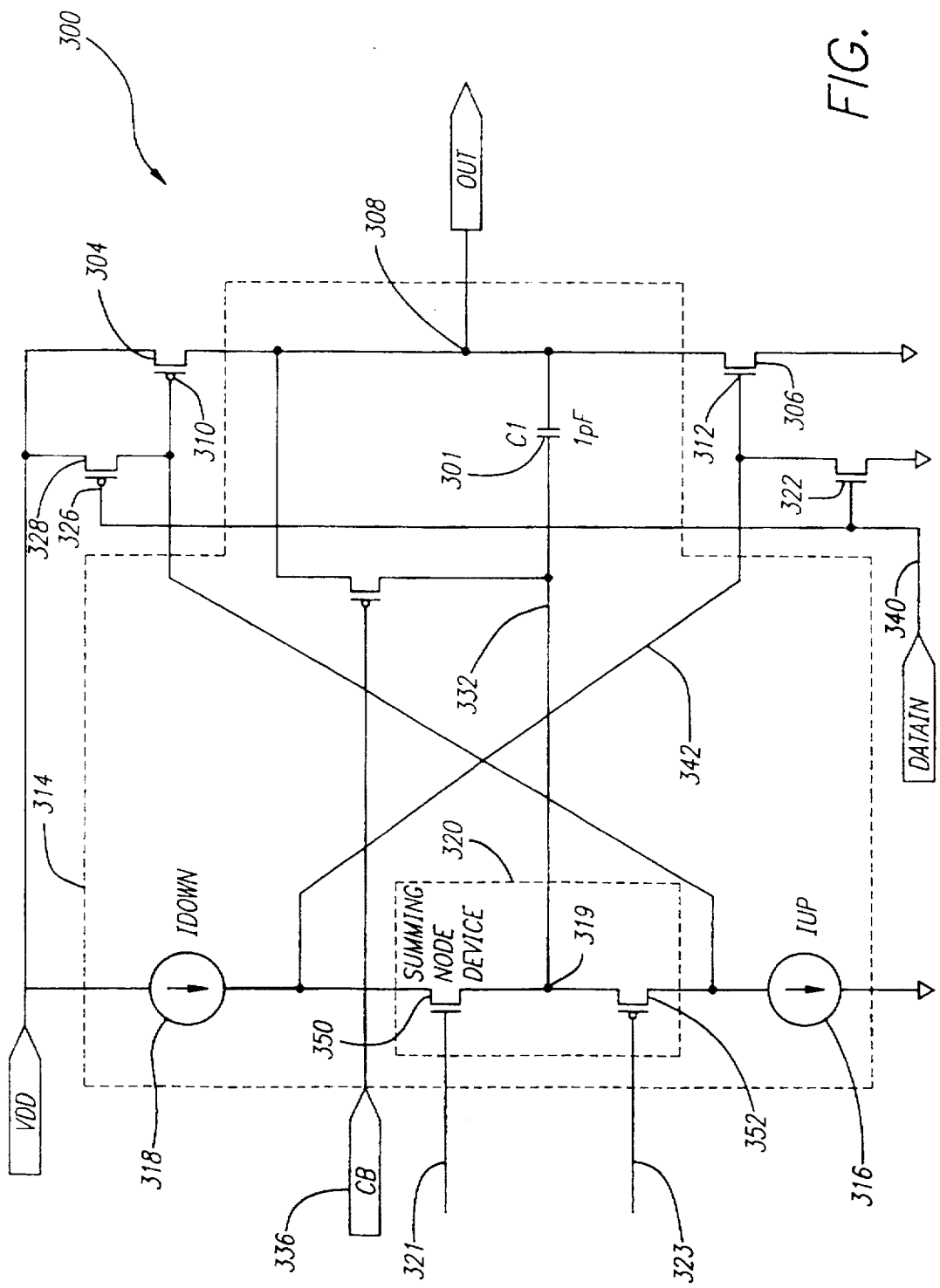
FIG. 3 illustrates a driver circuit according to the present invention.

FIG. 3 illustrates a driver circuit 300 according to the present invention. The driver circuit 300, according to the present invention, can generate signals with extremely slow rise and fall times. The driver circuit 300 includes a first driving device 304 coupled to an output node 308 and a second driving device 306 coupled to the same output node 308. The first driving device 304 is a pull up device such as a PMOS transistor by way of non-limiting example. The first driving device 304 transmits a voltage $V_{DD}$ to the output node 308 by "pulling up" to $V_{DD}$ a bus line (not shown) coupled to the output node 308. First driving device 304 "sources" sufficient current to pull up and hold the line at $V_{DD}$ for the duration of a data transfer cycle. Typically when the driver circuit 300 transmits a logic "1" signal ($V_{DD}$), a gate 310 of PMOS transistor 304 is set to a voltage level such that the difference between $V_{DD}$ and the voltage at gate 310 exceeds the threshold voltage for transistor 304.

The driver circuit 300 further includes a second driving device 306 coupled to the output node 308. In the preferred embodiment, the second driving device 306 is a pull-down device such as an NMOS transistor. When the driver transmits a logic "0" (ground) signal on the bus line, it pulls down the bus line to ground sinking sufficient current to pull down the output node 308 thereby holding it to the ground for the duration of a data transfer cycle. In this case, transistor device 306 conducts when a gate 312 of this transistor device 306 is set to a voltage level that is equal to or larger than the threshold voltage for transistor 306.

The driver circuit 300 further includes a slew rate controller circuit 314 shown in dotted line. The slew rate controller is coupled to the first and the second driving devices 304 and 306, respectively. The slew rate controller includes a first reference device 316 coupled to the first driving device 304. In the embodiment illustrated in FIG. 3, the first reference device 316 is a current source generating a first reference current $I_{UP}$. The slew rate controller further includes a second reference device 318, coupled to the second driving device 306. In the embodiment illustrated in FIG. 3, the second reference device 318 is a current source generating a second reference current $I_{DOWN}$. The slew rate controller further includes a summing device 320 (shown in dotted line). Summing device 320 includes NMOS transistor 350 coupled via a gate thereof to a bias line 321, and a PMOS transistor 352 coupled via a gate thereof to another bias line 323. The summing device 320 is also coupled to the first and second reference devices 316 and 318, respectively. Summing device 320 generates at the output node 308 a slew rate proportional to the first reference current $I_{UP}$ when the first driving device 304 is conducting. Moreover, the summing device 320 generates at the output node 308 a slew rate proportional to the second current when the second driving device 306 is conducting. The slew rate controller further includes a branch 332 with an integrator device 301 which integrates a current flowing therethrough. In this particular embodiment, integrator device 301 is a capacitor C1 coupling the output node 308 to the summing device 320.

The driver circuit 300 also includes a first switching device 328 coupled to the first driving device 304. The first switching device 328 can be a PMOS transistor with its gate 326 coupled to a data input terminal 340. Data input terminal 340 can be coupled to a digital circuit (not shown) generating CMOS level voltages to be transmitted by driver 300. The driver circuit 300 also includes a second switching device 322 which can be an NMOS transistor coupled to a gate 312 of the second driving device 306. The second switching device 322 has a gate coupled to the data input terminal 340. The switching devices 328 and 322 are turned ON or OFF alternatively by the voltage set at the data input terminal 340. When the first switching device 328 is ON, the second switching device 322 is OFF, and vice versa. Accordingly, the switching devices 328 and 322 alternately turn ON the driving devices 304 and 306, respectively, such that when the first driving device 304 is ON, this device substantially pulls up the output node 308 to the upper rail voltage ($V_{DD}$). Alternatively, when the second driving device 306 is ON, this transistor device substantially pulls down the output node 308 to the lower rail (ground).

Considering first the case where the output node 308 is low, i.e., set to logic level 0, the second switching device (transistor 322) has just been turned on, and the first switching device (transistor 328) has just been turned off. Transistor 322 is typically turned on by applying a high logic level voltage at the gate of this transistor. Typically, this is accomplished by setting the data input terminal 340 at logic level 1. Concomitantly, by setting the data input terminal 340 at logic level 1, the first switching device 328 (transistor 328) is shut off, as the difference between the voltage at gate 326, of the transistor 328, and $V_{DD}$ is lower than the threshold voltage of the PMOS transistor 328. In this case, the drain of transistor 328 is not pulled up sufficiently enough by transistor 328 to reach a voltage value close to $V_{DD}$. Therefore, gate 310 of transistor 304, which is coupled to the drain of transistor 328, is not held to a voltage level close to $V_{DD}$ which otherwise would shut off transistor 304. Also, by shutting off transistor 328, which otherwise sources most of the current $I_{UP}$ of the current source 316, more current is available to charge up gate 310 of transistor 304 via up-branch 330 coupled to the current source 316. Consequently, the difference between the voltage at the gate 310 of transistor 304 and $V_{DD}$ exceeds the threshold voltage necessary to turn on transistor 304. Typically, the current $I_{UP}$, which has a fixed value, is equal to the sum of the current flowing through the up-branch 330 and the current Ic flowing through the capacitor $C_1$. These two currents are summed up at the summing device 320 when transistor 304 conducts.

At the beginning of a cycle, before transistor 304 is turned on, the current flowing through a capacitive branch 332, which includes capacitor $C_1$, is approximately 0. Accordingly, at the beginning of a cycle, the current flowing through the up branch 330 is substantially equal to the $I_{UP}$ current. The current $I_{UP}$ charges the gate of transistor 304, causing this transistor to turn on and to begin pulling the output node 308 upward towards $V_{DD}$. As the output node 308 begins to rise in voltage, a current, $I_C$ is induced via capacitor $C_1$. This current is substantially equal to $C_1 \times dVout/dt$, where Vout is the voltage at the output node 308, and dVout/dt is the slew rate, during rise time, for the output voltage at the output node 308.

Summing device 320 includes a summing node 319 coupled to the source of transistor 350 and to the source of transistor 352. Summing node 319, acting as a virtual ground, is held at a substantially constant voltage (approximately ⅔ $V_{DD}$–VT) when there is no transition in progress at output node 308. Transistors 350 and 352 are biased, via lines 321 and 323, respectively, such that these transistors are both near cut$_{off}$ in the absence of a transition at output node 308. Variations in signal at the output node 308, therefore, have a very minor impact upon the voltage at the summing node 319. In this way, it is ensured that the current through capacitor $C_1$ is substantially equal to $C_1 \times dVout/dt$. Accordingly, variations at the output node 308 do not significantly affect the voltage at the summing node 319 and, thus, the equality $I_C = C_1 \times dVout/dt$.

As current $I_C$ increases, less current flows through the up-branch 330 as the sum of the current flowing through branch 330 and the current $I_C$ is limited by the current $I_{UP}$. Eventually, the circuit 300 reaches equilibrium when the current flowing through the capacitor $C_1$, i.e., $C_1 \times dVout/dt$ is equal to $I_{UP}$. In this case, the slew rate dVout/dt, for rise time, is substantially equal to the ratio of $I_{UP}/C_1$ which remains substantially constant in time. Accordingly, when transistor 304 is conducting and is driving a transmission line coupled to output node 308, the slew rate is directly proportional to $I_{UP}$ and inversely proportional to $C_1$.

The driver circuit, according to the present invention, further includes a clamping device 334 for clamping the output node to a predetermined voltage level. The clamping device 334 is coupled to the output node 308 and to the summing node 319 of the summing device 320. In a non-limiting implementation, the predetermined voltage level at which the output node is clamped is ⅔ $V_{DD}$. Accordingly, when the output node reaches ⅔ $V_{DD}$, transistor 334 conducts thereby diverting all available current from transistor 304, which otherwise would have flown via capacitor $C_1$, thereby forcing the output node 308 at ⅔ $V_{DD}$. This scheme is implemented by designing transistor 334 to turn on when a bias voltage approximately equal to ⅔ $V_{DD}$–$V_T$, where $V_T$ is the threshold voltage of transistor 334, is applied to the gate of this transistor. When the voltage at the output node reaches to ⅔ $V_{DD}$, and therefore the difference between the voltges of the source and gate of transistor 334 is $V_T$, transistor 334 starts diverting the current, otherwise flowing from the drain of transistor 334 to capacitor $C_1$. Accordingly, the current flowing via capacitor $C_1$ is substantially equal to 0, and the ratio dVout/dt, which is equal with $IC/C_1$, is 0. Consequently, the voltage at the output node is clamped to ⅔ $V_{DD}$.

Referring now to the case where the output node 308 is high, data input terminal 340 is set to a low voltage, and 328 is turned on, while transistor 322 is turned off. At the beginning of the cycle, the current $I_{DOWN}$ flows almost entirely through down-branch 343 and not through transistor 350. With transistor 322 being substantially turned off, a substantial part of the $I_{DOWN}$ current, flown via a down-branch 343, is not flowing to the ground via transistor 322. Rather, the current flowing via down-branch 343 starts charging gate 312 of the pull down transistor 306. Consequently, transistor 306 turns on beginning to pull output node 308 downwardly towards ground. As the voltage at the output node 308 begins to fall, a current equal to $C_1 \times dVout/dt$ is induced in $C_1$, where dVout/dt is the slew rate for the fall time of the output node voltage. Eventually, some of the current starts flowing through capacitor $C_1$ via transistor 350, once the gate of transistor 306 is charged up to a voltage exceeding the threshold voltage for that transistor. As the voltage at the gate 312 of transistor 306 increases, the current via capacitor $C_1$ increases causing more current to flow via the drain-source channel of transistor 350. Consequently, the current through down-branch 343 decreases as the current through capacitor $C_1$ and the sum of this current and of the current through down-branch 343 is constant and equal to $I_{DOWN}$. Eventually, $I_{DOWN}$ flows almost entirely via capacitor $C_1$ and through transistor 350, such that in equilibrium $I_{DOWN} = C_1 \times dVout/dt$. Accordingly, in equation the slew rate dVout/dt for the fall time at output node 308 is defined by the ratio of $I_{DOWN}/C_1$.

Figure 4:
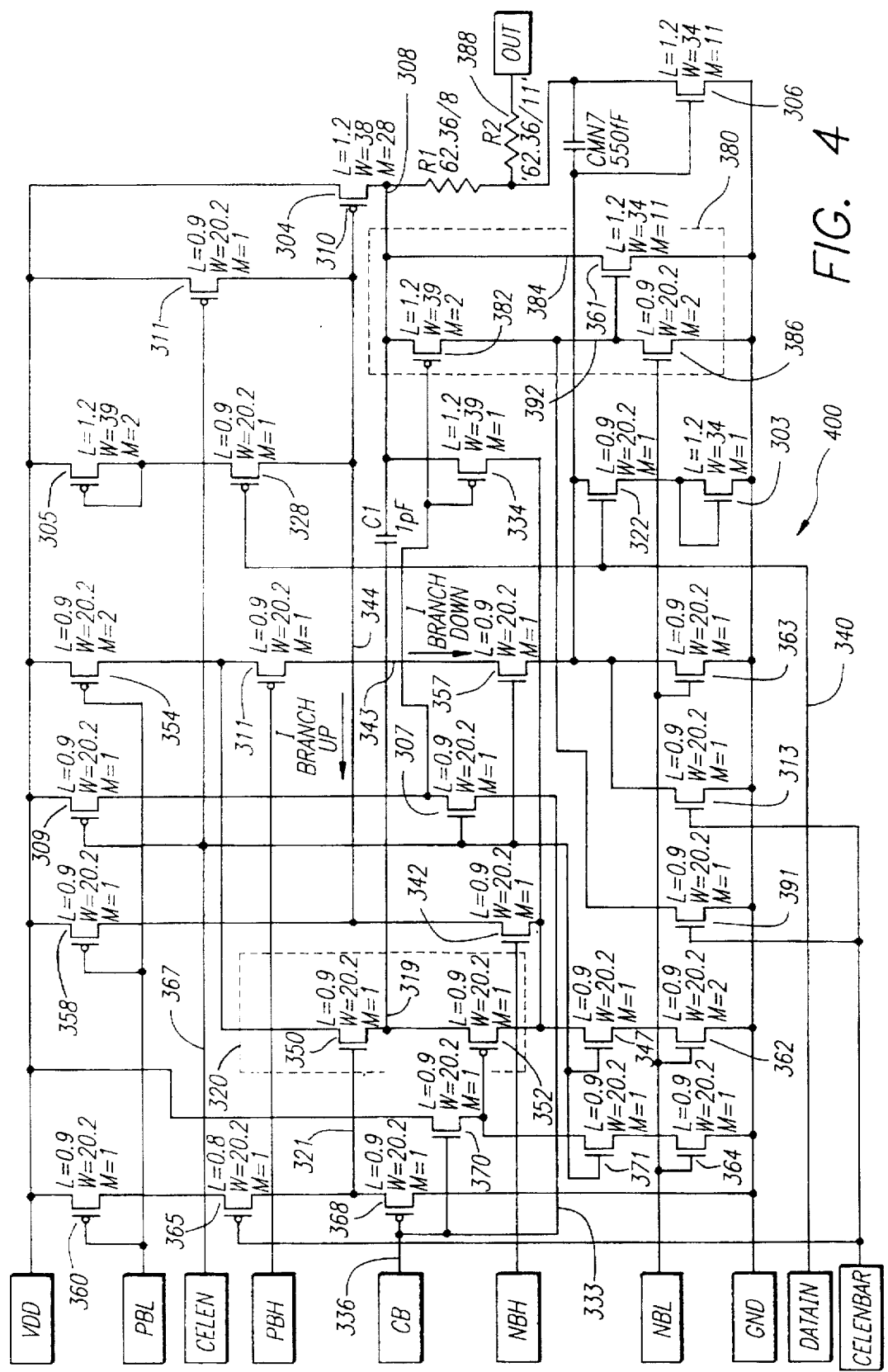
FIG. 4 is a more detailed illustration of the driver circuit according to the present invention.

Referring now to FIG. 4, the driver circuit 400, according to the present invention, is illustrated in more detail. A controlled slew rate on the falling edge in the output signal at node 308 is produced as follows. When the output node 308 is set to a high voltage level, and this voltage is constant, no current flows through capacitor $C_1$, when there is no transition in progress at the output node 308, transistors 350 and 352 are biased such that node 319 is set at ⅔ $V_{DD}$–VT. These transistors both operate near cutoff when no transition occurs at output node 308. Any movement of node 319 from ⅔ $V_{DD}$–VT in the negative direction turns transistor 350 on. Similarly, any movement in the voltage at the output node 319 from ⅔ $V_{DD}$–VT in the positive direction turns on transistor 352. Node 319, therefore, is biased at approximately ⅔ $V_{DD}$–VT. With the DATA IN signal at data in terminal 340 high, transistor 322 holds the gate of the driver transistor 306 at a sub-threshold voltage substantially equal to the voltage on the diode-connected transistor 303. The diode-connected transistor 303 allows the driver transistor 306 to start conducting very fast upon transition of the DATA IN signal from high to low. When the DATA IN signal goes low, current flows through transistors 354, 311, and 357, and into the gate of transistor 306 thereby charging up this gate. With transistor 350 off, all the current sourced by transistor 354, approximately 40 μa, (hereinafter, "two units of current") flows through transistor 311 ($I_{branch-down}$). Transistor 354 acts as a current source for generating current $I_{DOWN}$. Transistors 354, 358, and 360 are coupled in a current mirror configuration. The current through transistor 354 is, however, twice the current through 360 and 358 as transistor 354 is a 2× device, i.e., made up of two identical transistors coupled in parallel. Since transistor 363, set up as current source, draws one unit (20 microamps) away from the two units of current sourced by transistor 354, a net of one unit of current charges up the gate of transistor 306. When the voltage at the gate of transistor 306 rises above the threshold voltage of this transistor, transistor 306 begins to draw current starting the negative transition at the output node 308.

As soon as the voltage at the output node 308 starts decreasing, a current IC flows through capacitor $C_1$ according to the equation $I_C = C_1 \times dv/dt$. The current $I_C$ pulls node 319 slightly below ⅔ $V_{DD}$–VT, turning on transistor 350. As soon as transistor 350 is on, the node 319 does not go much lower and all of the current $I_C$ is conducted by 350. Transistor 350 diverts current otherwise drawn by transistor 311 thereby reducing the current flowing through the gate of transistor 306. In equilibrium, when the current through capacitor $C_1$ is equal to one unit of current, transistor 350 is also conducting one unit of current leaving only one unit to flow through transistor 311. Since transistor 363 is sinking a unit of current, no net current flows into the gate of transistor 306. The gate voltage of transistor 306 stabilizes, fixing the slew rate of the voltage at the output node 308.

If the voltage at the output node 308 exceeds a projected voltage value that correspond to a projected constant slew rate at node 308, the current $I_C$ is greater than one unit and the current through the transistor 311 becomes less than one unit. This means that the net current flowing into the gate of the transistor 306 is negative and the gate voltage on this transistor decreases, acting to reduce the transition slew rate at the output node 308. This current balancing continues until the output node 308 reaches ground. At this point, the slew rate is forced to 0 again and no current flows through the capacitor $C_1$.

When there is no transition in progress at the output node 308, the current $I_{UP}$ collected at the source of NMOS transistor 342 is the sum of a current flowing through transistor 358 and the $I_{branch-up}$ current flowing through up branch 344. The up branch 344 is coupled to gate 310 of transistor 304 and to the drain of the first switching device, transistor 328. PMOS transistor 358 is part of a current mirror controlled by the voltage at the line coupled to the gate of this transistor. Typically, transistor 358 sources one unit of current which in the preferred embodiment is approximately 20 microamps (µa).

Transistor 362 operates as a current source sinking two units of current (note the X2 notation at 362) each unit being 20 µa. Transistors 362, 364 and 363 are coupled in a current mirror configuration and the current through 362 is twice the current through transistors 363 and 364. Transistor 362, generating the current $I_{UP}$, is controlled by the bias voltage at the gate of this transistor. Transistor 342 acts as a cascode device for transistor 362, to increase transistor 362's effective output impedance, making transistor 362 closer to an ideal current source.

When no current flows through the capacitor $C_1$, the current via the up-branch 344 is substantially equal to the current flowing through transistor 358, i.e., one unit of current. Transistor 362 sinks two units of current made up by the sum of the current via up-branch 344 and the current sourced by transistor 358. Before a transition from low to high occurs, the output node 308 is low, no current flows through capacitor $C_1$ and the node 319 is biased at ⅔ $V_{DD}$–VT. When the DATA IN signal at terminal 340 transitions from low to high, current I branch-up discharges the gate of transistor 304 to a voltage low enough that the difference between the voltage at the gate of 304 and $V_{DD}$ exceeds the threshold voltage of transistor 304. Consequently, some current starts flowing via transistor 304 and through capacitor $C_1$. The current through capacitor $C_1$ pulls the node 319 slightly above ⅔ $V_{DD}$–VT turning ON transistor 352. The current flowing through capacitor $C_1$ further flows via transistor 352 and into the node coupled to the source of transistor 342. As the current $I_C$, flowing via capacitor $C_1$, increases, the current I branch-up decreases by approximately the amount of current $I_C$. In equilibrium, current flowing through branch-up 344 eventually becomes substantially equal to 0, such that the current flowing through $C_1$ is substantially equal to one unit of current. In this case, the slew rate is defined by $dv/dt = I_{up}/C_1$.

Transistors 360 and 368 provide bias to transistor 350, while transistors 370 and 364 provide bias to transistor 352. Transistor 358 provides some "OFF" bias current to the gate of the transistor 304 while transistor 363 provides some "OFF" bias current to the gate of transistor 306. Transistors 307, 309, 311, 313, and 391 turn off all corresponding drives during tri-state condition. Transistors 303 and 305, diode-like connected in series with transistors 322 and 328 respectively, allow the OFF gate voltage potentials of transistors 306 and 304, respectively to be near a threshold voltage of these transistors such that the time required to switch these transistors to "on" condition is substantially reduced. Accordingly, transistors 303 and 305 prevent a pause at the output node while gate charging for transistors 304 and 306 occurs such that the time required to switch these transistors on in conduction is substantially required.

The slow speed driver according to the present invention further includes power switches for decreasing the power consumption at times when it is desired that the slow speed driver is idle. PMOS transistor 365, which is coupled to the signal CELENBAR discontinues a current path between transistors 360 and 368 when the signal CELENBAR is set to logic high. Accordingly, transistor 350 is not biased at its gate via line 321 such that this transistor is off when the signal CELENBAR is high. Furthermore, the signal CELENBAR is routed to a gate of NMOS transistor 391. Transistor 391 is coupled at a drain thereof to node 392. When the signal CELENBAR is high, transistor 391 is on thereby pulling node 392 down to ground. Accordingly, transistor 361 is cut off when the signal CELENBAR is high. Transistor 313 has its gate coupled to signal CELENBAR. The drain of this transistor is coupled to the gate of transistor 306. This transistor insures that when the signal CELENBAR is high, the gate of transistor 306 is pulled down to ground and therefore transistor 306 is substantially cut off.

The slow speed driver circuit 400 further includes a line 367 coupled to a signal CELEN. When the signal CELEN is set to logic 0, the following current paths are discontinued. First, transistor 307 is switched off, thereby preventing transistors 334 and 382 from being biased. Additionally, transistor 309 pulls the gates of transistors 334 and 382 up to $V_{DD}$ thereby shutting off these transistors. Additionally, the signal CELEN drives the gate of the NMOS transistor 357. When the signal CELEN is low, no current is driven to the gate of transistor 306 such that this transistor is not able to drive the output node to ground.

Furthermore, circuit 400 includes PMOS transistor 311 which is coupled at its source thereof to $V_{DD}$, and at its drain thereof to gate 310 of the upper driver 304. When the signal CELEN is set to logic level 1, this transistor is cut off and the slow speed driver functions as explained in the foregoing. However, when the signal CELEN is set to logic 0, transistor 311 works as a leakage stopper shorting the gate of transistor 304 to $V_{DD}$ such that no current leakage occurs through transistor 304. Transistor 304 is a very large transistor having 26 transistors in parallel. Since this transistor could consume a large amount of power even when a leakage current flows through transistor 304, transistor 311, when turned on, saves a considerable amount of power for circuit 400.

The signal CELEN is also coupled to NMOS transistors 371 and 347. Transistor 371 is coupled at its drain thereof to the source of transistor 370 and at its source thereof to the drain of transistor 364. Accordingly, when the signal CELEN is set to logic 0, transistor 371 is cut off, shutting off the current path via transistors 370 and 364 thereby cutting off the bias from the gate of transistor 352. Similarly, transistor 347 discontinues the current path via transistors 358, 342 and 362 thereby decreasing the power consumed by these transistors.

The driver circuit 400, according to the present invention, further includes a termination device 380 (shown in dotted lines). The termination device 380 is coupled to the output node 308. The termination device 380 includes a triggering device 382 and a termination path 384. Additionally, the termination device includes a transistor device 386 which is part of a current mirror device formed by transistor device 362 and transistor device 386. The transistor devices 362 and 386 are X2 devices each including two NMOS transistors coupled in parallel. Each of these two NMOS transistors coupled in parallel are substantially identical with transistor device 364. The triggering device 382 is biased at a gate thereof to a voltage equal to $\frac{2}{3} V_{DD} - VT$, where VT is the threshold voltage of the triggering device 382. Clamping device 334, which is coupled to the output node 308 is biased via line 333 at $\frac{2}{3} V_{DD} - VT$, where VT is the threshold voltage of the clamping device 334. The clamping device 334 clamps the voltage at the output node 308 to a first predetermined voltage value, which in the preferred embodiment is $\frac{2}{3} V_{DD}$.

The termination device 380 provides a current path from output 308 to ground or the lower rail $V_{SS}$, for currents reflected from a transmission line 388 coupled to output node 308. The termination device 380 insures that once a reflection having an amplitude which exceeds a second predetermined value, such as $\frac{2}{3} V_{DD} + 50$ or 60 millivolts, occurs, a reflected current associated with the reflection flows through the termination device 380 to the ground instead of flowing through the first driving device 304 causing damage thereto.

The triggering device 382 causes a current flow via termination path 384 when a voltage at the output node 308 exceeds a second predetermined voltage level ($\frac{2}{3} V_{DD} + 50$ mv), and the second predetermined voltage level being higher than the first predetermined voltage level ($\frac{2}{3} V_{DD}$). The difference between the second predetermined voltage level and the first predetermined voltage level is selected to be approximately 50 or 60 millivolts. The termination path includes device 361. In the preferred embodiment illustrated in FIG. 4, the termination device 361 is a NMOS transistor. As transistors 334 and 382 are biased at $\frac{2}{3} V_{DD} - VT$, when the voltage at the node 308 is approximately equal to $\frac{2}{3} V_{DD}$, transistor 334 starts conducting. Transistor 334 diverts all of the current otherwise flowing through capacitor $C_1$ thereby clamping the voltage at the output node 308 to $\frac{2}{3} V_{DD}$ as explained in the foregoing. In such way, when the first driving device 304 is conducting the clamping device 334 insures that the voltage at the output node 308 does not exceed $\frac{2}{3} V_{DD}$.

However, if a reflection is present on line 388 and this reflection has a voltage amplitude exceeding $\frac{2}{3} V_{DD} + 50$ millivolts, the triggering device 382 starts conducting. Transistor 382, however, does not fully conduct when the voltage at node 308 is lower than $\frac{2}{3} V_{DD}$, substantially equal to $\frac{2}{3} V_{DD}$, or $\frac{2}{3} V_{DD}$ plus a voltage less than 50 to 60 millivolts. The reason is that when transistor 382 conducts current, the current therethrough is twice as large as the current through transistor 334 and therefore transistor 382 requires a higher gate to source ($V_{GS}$) voltage difference than $\frac{2}{3} V_{DD} - V_T$.

The current through transistor 382 is substantially equal to the current flowing through transistor 386 which is part of a current mirror formed by this transistor in cooperation with transistor 362. The currents through transistors 386 and 382 are twice as large as the current through transistor 334 for the following reason. When transistor 334 conducts, i.e., when the voltage at the output node 308 is equal or greater than $\frac{2}{3} V_{DD}$, the current through transistor 334 is half the current (one unit of current) flowing through transistor 362. This is so because, in equilibrium, when transistor 334 diverts current from capacitor $C_1$, no current flows through transistor 352 via the capacitor $C_1$ or through up-branch 344. The current flowing through transistor 342 is therefore equal to the current sunk by transistor 362 minus the current flowing through the current source transistor 358, since the current sunk by transistor 362 is two units of current and the current sourced by transistor 358 is one unit of current. Transistor 334 conducts one unit of current.

The current flowing through transistor 386, and also through transistor 382, is twice as large as the current flowing through transistor 334, since transistor 362 is coupled to transistor 386 and these transistors have the same size. Since transistor 382 conducts a current twice as large as transistor 334 and these transistors have the same size and are biased at the gates thereof by the same voltage, i.e., $\frac{2}{3} V_{DD} - VT$, transistor 382 starts conducting when the difference between the voltage at its gate and the voltage at its source is larger than the same voltage difference for transistor 334. In the preferred embodiment, transistor 382 conducts when the difference between the voltage at its gate and the voltage at the output node 308 is larger than the threshold voltage for transistor 382 plus 50 millivolts. In this way, it is insured that when a reflection, with an amplitude of $\frac{2}{3} V_{DD} + 50$ millivolts or larger occurs on line 388, the circuit 400 is terminated, i.e., the termination device 380 absorbs all the current reflected at the output node 308.

Once the transistor 382 starts conducting, it pulls up the node 392, coupled to the drain of the transistor 382 and to the gate of transistor 361, thereby providing bias to transistor 361 which starts conducting. Transistor 361 is an x11 device, i.e., it has eleven transistors in parallel having the size indicated in the figure. Accordingly, transistor 361 can absorb a very large current. Note that the termination device 380 in conjunction with the clamping device 334 insure that the first driving device 304 turns off once the voltage at the output node 308 exceeds $\frac{2}{3} V_{DD}$. This is so because once the voltage exceeds $\frac{2}{3} V_{DD}$, transistor 334 which diverts the current otherwise flowing through capacitor $C_1$, turns off the first driver 304, before transistor 361 included in the termination path turns on. In this way, the flow of a relatively large current through first driver 304 is avoided. Additionally, reflections back from the slow speed driver 400 to other peripherals that may be coupled to another end of the transmission line are avoided thereby decreasing the risk that a peripheral may receive a signal from the driver at a voltage higher than the upper rail supply voltage of the peripheral.

Figure 5:
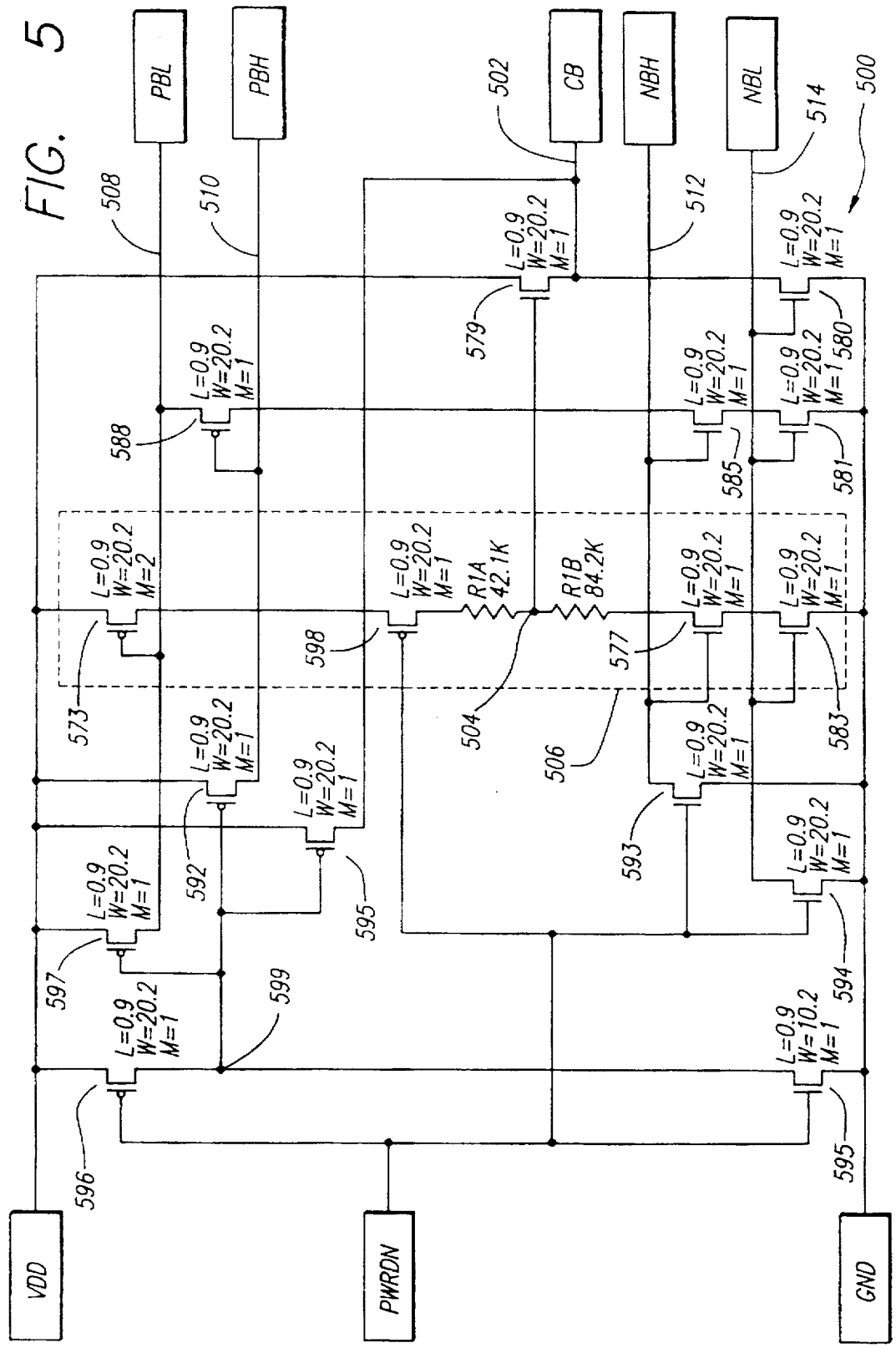
FIG. 5 illustrates a bias regulator in conjunction with the driver circuit according to the present invention.

Circuit 400 is biased by a bias regulator circuit 500 illustrated in FIG. 5. The bias regulator provides a reference bias point at the output terminal 502 of $\frac{2}{3} V_{DD} - V_T$, where $V_T$ is the threshold voltage of transistors 334 and 382. Terminal 502, which is coupled to terminal 336 of circuit 400 illustrated in FIG. 4, provides bias to transistors 334 and 382. Bias regulator 500 also provides bias to other devices of driver circuits 300 and 400, shown in FIGS. 3 and 4, via terminals 508 (PBL), 510 (PBH), 512 (NBH), and 514 (NBL). Transistors 573, 598, 577, and 583 together with resistors R1A and R1B form a passive-active divider 506 (shown in dotted lines). Node 504 is coupled to resistor R1A. Node 504 is coupled to diode-connected transistor 573 via R1A and transistor 598. Resistor R1B, which has twice the value of resistor R1A, is coupled to diode-connected transistor 577 which is also coupled to diode-connected transistor 583 as shown in the figure. The passive-active divider has an impedance ratio of one unit at the upper part of node 504 and two units at the lower part of node 504. A voltage of approximately ⅔ $V_{DD}$ is thus produced at the node 504. This voltage value is buffered via transistor 579 to offset the value of ⅔ $V_{DD}$ by approximately one $V_T$ such that the voltage at terminal 502 is approximately ⅔ $V_{DD}-V_T$.

The bias regulator 500 also provides bias voltages for the current mirrors shown in FIG. 4. Assuming that one unit of current is flowing down through resistor R1A and R1B, this current flows also through the diode connected devices 577 and 583. The current in 577 and 583 induces the same one unit of current in transistors 585 and 581, which are connected to devices 577 and 583, respectively, in a current mirror configuration. Transistors 585 and 581 are coupled in a cascode configuration to minimize voltage sensitivity. Furthermore, the current flowing via transistor 585 also flows through transistors 588 and 573 such that 573 has two units of current flowing therethrough. One unit of current flows through the path including resistor R1A and another unit of current flows through the path including transistors 588, 585, and 581. However, the size of transistor 573 is twice the size of the transistor 588, since device 573 is made up of 2 identical transistors coupled in parallel, while 588 is made up of only one transistor. Accordingly, the resistance of the drain-source channel of transistor 573 is half the resistance of the drain-source channel of transistor 588. Consequently, the voltage drop across transistors 573 and 588 is essentially equal as the resistance of the drain source channel of 573 is half the size of the resistance of the channel of 588, while the current via transistor 573 is twice as large as the current via transistor 588.

The bias regulator 500 further incudes a power management circuit for substantially reducing the power consumed by the bias regulator. The power management circuit includes a CMOS inverter having NMOS transistor 595 and PMOS transistor 596 receiving at their gates a signal PWRDN. The output 599 of the CMOS inverter is coupled to a gate of PMOS transistor 597 such that when the PWRDN is set to logic level 1 the output of the CMOS inverter at node 599 is 0 having PMOS transistor 597 thereby pulling line 508 to upper rail $V_{DD}$. Similarly, transistors 595 and 592 pull lines 502 and 510 to the upper rail $V_{DD}$. In such way, lines 508, 510 and 502 which are coupled to the input lines PBL, PBH, and CB, of the slow speed driver illustrated in FIGS. 3 and 4 are all set to $V_{DD}$ thereby cutting off various PMOS transistors, of the slow speed drive, which have their gates coupled to these lines.

The PWRDN line is directly coupled to a gate of PMOS transistor 598. Transistor 598 serves as a power switch, included in the current path of the active divider 506. When the signal PWRDN is at 1, there is no current flowing through resistors R1A and R1B, and transistors 577 and 583. Additionally, the PWRDN signal is coupled to the gates of 593 and 594 such that when PWRDN is set to logic level 1, transistors 593 and 594 pull lines 512 and 514 respectively to the lower rail or ground. Accordingly, the input lines NBH and NBL are pulled to the ground thereby disabling the NMOS transistors of the circuit 400 which have their gates coupled to the lines NBH and NBL.

The circuits illustrated in FIGS. 3, 4, and 5 can be implemented with devices already existent in a gate array circuit. Circuits 3, 4 and 5 are therefore well-suited to applications, in which it is not feasible or practical to add substantially other devices in an already existent circuit.

Figure 6:
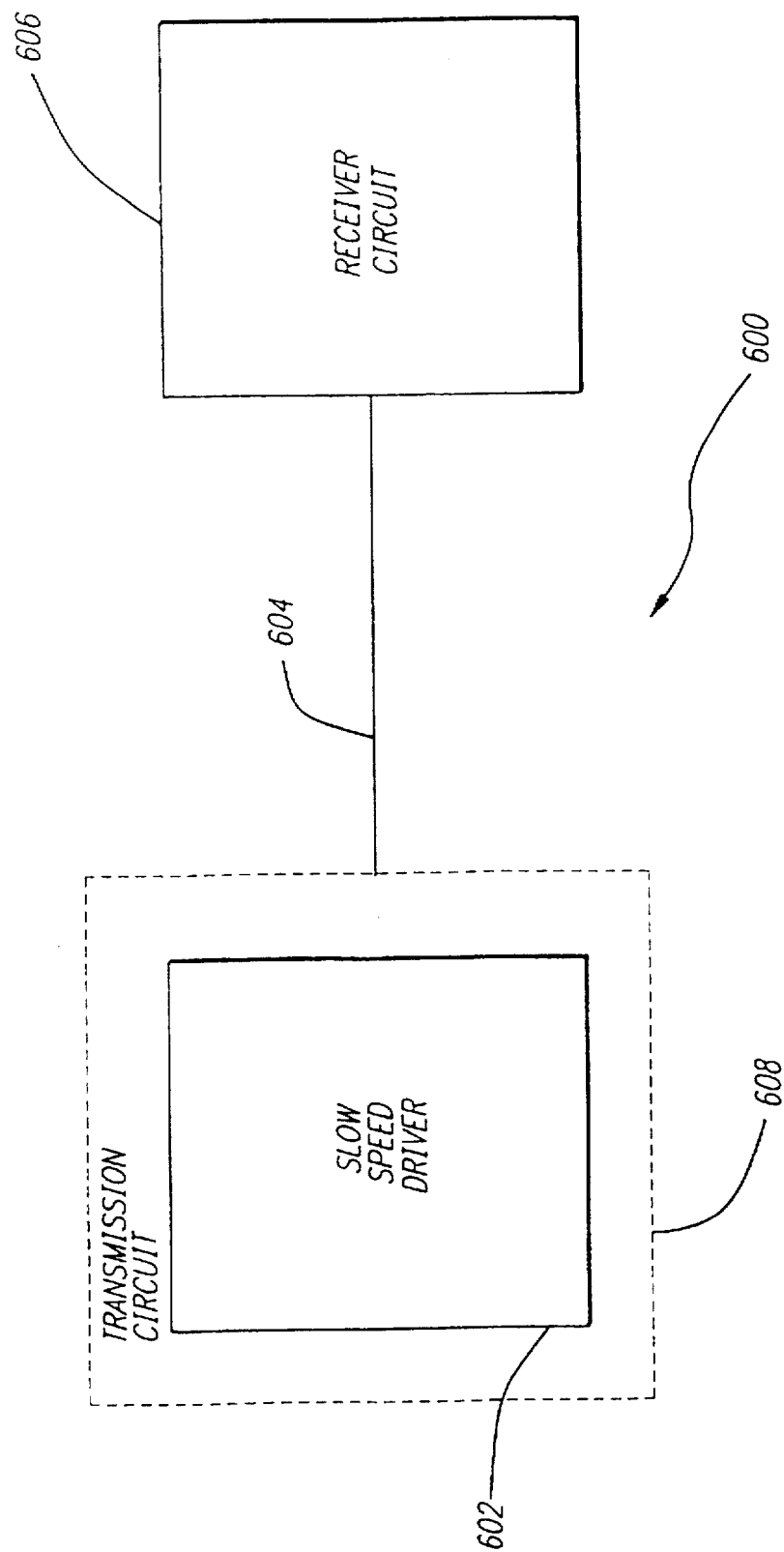
FIG. 6 illustrates a block diagram of a transmission/receiver system incorporating the present invention.

FIG. 6 illustrates a transmitter/receiver system 600 incorporating the present invention. Digital data is transmitted by a transmitter circuit 608 via a transmission line 604 to a receiver circuit 606. A slow speed driver 602 incorporating the circuit illustrated in FIGS. 3 and 4 is included in the transmitter circuit 608. The transmission of data is performed according to a Universal Serial Bus (USB) protocol standard. For information related to USB see *The Universal Serial Bus Device Class Definition for Communication Devices*, 0.7 Draft Revision available from Intel Corporation, Santa Clara, Calif.

In the foregoing specification, the invention has been described with reference to specific embodiments thereof. It is evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A driver circuit having an output node, said driver circuit comprising:
    a first driving device coupled to said output node;
    a second driving device coupled to said output node; and
    a slew rate controller coupled to said first and second driving devices, said slew rate controller including
        a first reference device, coupled to said first driving device, to generate a first current,
        a second reference device, coupled to said second driving device, to generate a second current, and
        a summing device coupled to said first and second reference devices, said summing device coupled to said output node via an integrating device to generate at said output node a signal with a slew rate proportional to one of said first and second currents when one of said first and second driving devices respectively is substantially conducting.

2. The driver circuit of claim 1 wherein said integrating device is a capacitive device having a capacitance C.

3. The driver circuit of claim 2 wherein said slew rate at said output node is proportional to said capacitance C.

4. The driver circuit of claim 1 further including a first switching device, coupled to said first driving device, for switching said first driving device.

5. The driver circuit of claim 4, further including a second switching device, coupled to said second driving device, for switching said second driving device.

6. The driver circuit of claim 1 including a clamping device coupled to said output node and to said summing device.

7. The driver circuit of claim 1 wherein said first driving device is a pull up device.

8. The driver circuit of claim 1, wherein said second driving device is a pull down device.

9. In a gate array device a driver circuit having an output node, said driver circuit comprising:
    a first driving device coupled to said output node;
    a second driving device coupled to said output node; and
    a slew rate controller coupled to said first and second driving devices, said slew rate controller including
        a first reference device, coupled to said first driving device, to generate a first current;
        a second reference device, coupled to said second driving device, to generate a second current; and
        a summing device coupled to said first and second reference devices, said summing device coupled to said output node via an integrating device to generate at said output node a signal having a first slew rate proportional to said first current when said first driving device is substantially conducting, and a second slew rate proportional to said second current when said second driving device is substantially conducting.

10. The driver circuit of claim 9 wherein said integrating device is a capacitive device having a capacitance C.

11. The driver circuit of claim 10 wherein said first and second slew rates at said output node are proportional to said capacitance C.

12. The driver circuit of claim 9 further including a first switching device, coupled to said first driving device, for switching said first driving device.

13. The driver circuit of claim 12, further including a second switching device, coupled to said second driving device, for switching said second driver device.

14. The driver circuit of claim 9 including a clamping device coupled to said output node and to said summing device.

15. The driver circuit of claim 9 wherein said first driving device is a pull up device.

16. The driver circuit of claim 9, wherein said second driving device is a pull down device.

17. A system for transmitting and receiving information comprising:

a receiver circuit;

a transmission line having a first and second end, said first end being coupled to said receiver circuit;

a driver circuit to transmit data via an output node to said second end of said transmission line, said driver circuit including, a first driving device coupled to said output node;

a second driving device coupled to said output node; and a slew rate controller coupled to said first and second driving devices, said slew rate controller including:

a first reference device, coupled to said first driving device, to generate a first current;

a second reference device, coupled to said second driving device, to generate a second current; and a summing device, coupled to said first and second reference devices, said summing device coupled to said output node via a capacitive device having a capacitance C to generate at said output node, a first slew rate proportional to said first current when said first driving device is active, and a second slew rate proportional to said second current when said second driving device is active.

18. The system of claim 17 wherein said first and second slew rates at said output node are proportional to said capacitance C.

19. The system of claim 18 wherein said driver circuit further includes a first switching device, coupled to said first driving device, for switching said first driving device.

20. The system of claim 19 wherein said driver circuit further includes a second switching device, coupled to said second driving device, for switching said second driving device.

21. The system of claim 20 wherein said first driving device of said driver circuit is a pull up device.

22. The system of claim 19 wherein said second driving device of said driver circuit is a pull down device.

23. A driver circuit having an output node, said driver circuit comprising:

a first driving device coupled to said output node;

a second driving device coupled to said output node; and a slew rate controller coupled to said first and second driving devices, said slew rate controller including a first reference device, coupled to said first driving device, to generate a first current, a second reference device, coupled to said second driving device, to generate a second current, and a summing device coupled to said first and second reference devices, said summing device coupled to said output node via an integrating device to generate at said output node a signal with a slew rate proportional to one of said first and second currents when one of said first and second driving devices respectively is substantially conducting, said driver circuit further including a clamping device coupled to said output node and to said summing device.

24. The driver circuit of claim 23 wherein said integrating device is a capacitive device having a capacitance C.

25. The driver circuit of claim 24 wherein said slew rate at said output node is proportional to said capacitance C.

26. The driver circuit of claim 23 further including a first switching device, coupled to said first driving device, for switching said first driving device.

27. The driver circuit of claim 26, further including a second switching device, coupled to said second driving device, for switching said second driving device.

28. The driver circuit of claim 23 wherein said first driving device is a pull up device.

29. The driver circuit of claim 23 wherein said second driving device is a pull down device.

* * * * *